United States Patent
Macerola et al.

(10) Patent No.: US 11,704,047 B2
(45) Date of Patent: Jul. 18, 2023

(54) TEMPERATURE READINGS FOR MEMORY DEVICES TO REDUCE TEMPERATURE COMPENSATION ERRORS

(71) Applicant: Micron Technology, Inc., Boise, ID (US)

(72) Inventors: Agostino Macerola, San Benedetto dei Marsi (IT); Michele Piccardi, Cupertino, CA (US); Umberto Siciliani, Rubano (IT); Tommaso Vali, Sezze (IT); Enrico Favaro, Scorzè (IT)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 17/536,465

(22) Filed: Nov. 29, 2021

(65) Prior Publication Data

US 2022/0405002 A1  Dec. 22, 2022

Related U.S. Application Data

(60) Provisional application No. 63/212,273, filed on Jun. 18, 2021.

(51) Int. Cl.
*G06F 3/06* (2006.01)

(52) U.S. Cl.
CPC .......... *G06F 3/0653* (2013.01); *G06F 3/0604* (2013.01); *G06F 3/0673* (2013.01)

(58) Field of Classification Search
CPC .... G06F 3/0653; G06F 3/0604; G06F 3/0673; G11C 11/40626; G11C 16/3418–3431; G11C 7/04

See application file for complete search history.

(56) References Cited

U.S. PATENT DOCUMENTS

| | | | |
|---|---|---|---|
| 8,228,736 B2* | 7/2012 | Joo | G11C 11/406 365/201 |
| 2017/0071056 A1* | 3/2017 | Stoev | G11C 7/04 |
| 2020/0058348 A1* | 2/2020 | Belcourt | G06F 3/0607 |
| 2021/0294530 A1* | 9/2021 | Boehm | G06F 3/0653 |

OTHER PUBLICATIONS

M. Guan and L. Wang, "Improving DRAM Performance in 3-D ICs via Temperature Aware Refresh," in IEEE Transactions on Very Large Scale Integration (VLSI) Systems, vol. 25, No. 3, pp. 833-843, Mar. 2017, doi: 10.1109/TVLSI.2016.2606085. (Year: 2017).*

* cited by examiner

*Primary Examiner* — Khoa D Doan
(74) *Attorney, Agent, or Firm* — Lowenstein Sandler LLP

(57) ABSTRACT

A system includes a memory array, a thermometer, and control logic, operatively coupled with the memory array and the thermometer, to perform operations including causing the thermometer to obtain a first temperature result, monitoring a time since obtaining the first temperature result, determining whether the time satisfies a threshold time condition, in response to determining that the time satisfies the threshold time condition, causing the thermometer to obtain a second temperature result from an automatic temperature reading, determining a difference between the second temperature result and a previously stored temperature result, and filtering the second temperature result based on the difference to obtain a new stored temperature result.

20 Claims, 6 Drawing Sheets

US 11,704,047 B2

TEMPERATURE READINGS FOR MEMORY DEVICES TO REDUCE TEMPERATURE COMPENSATION ERRORS

RELATED APPLICATION

This application claims the benefit of U.S. Provisional Application 63/212,273 filed on Jun. 18, 2021, the entire content of which is incorporated by reference herein.

TECHNICAL FIELD

Embodiments of the disclosure relate generally to memory sub-systems, and more specifically, relate to temperature readings for memory devices to reduce temperature compensation errors.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
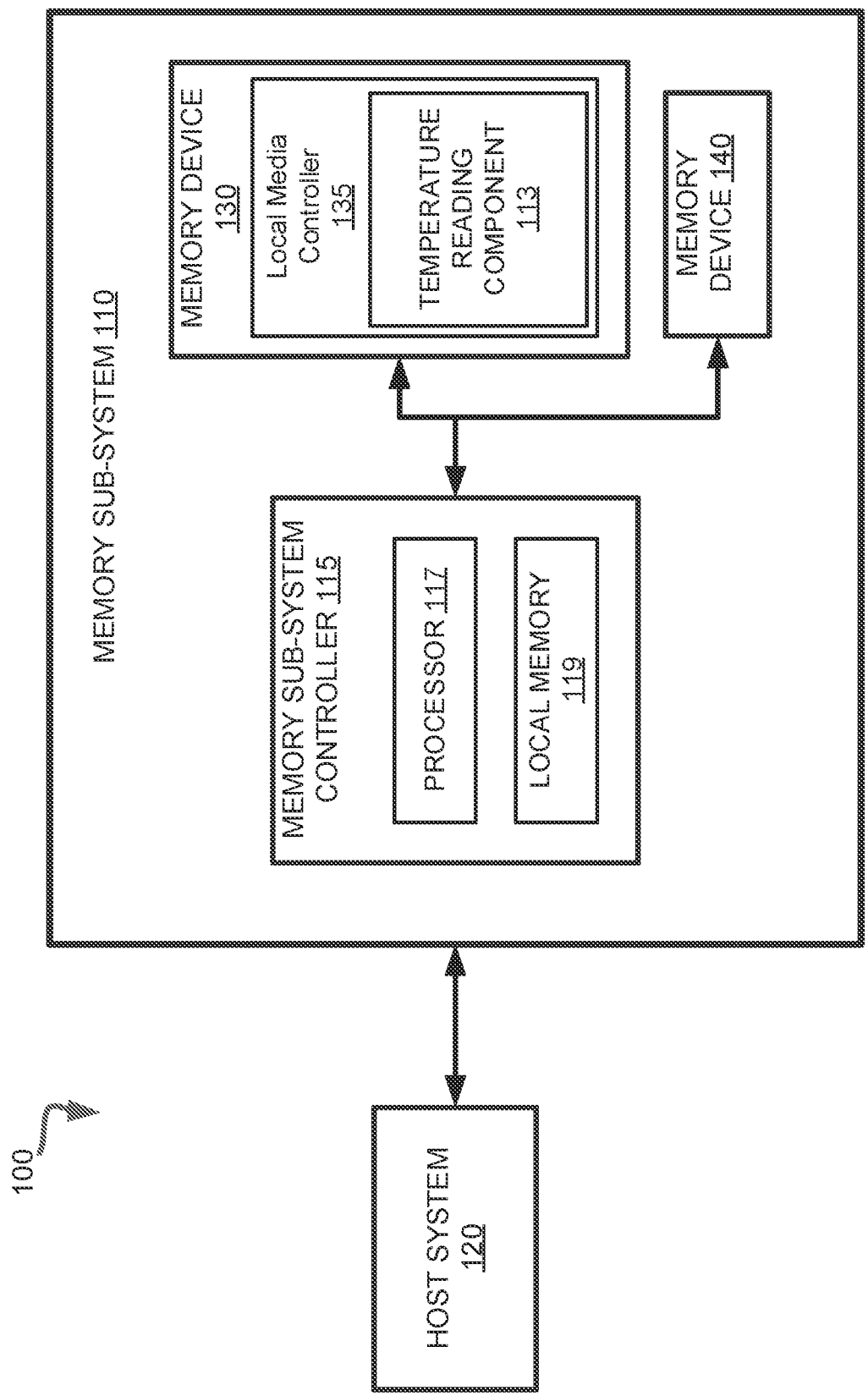
FIG. 1 illustrates an example computing system that includes a memory sub-system in accordance with some embodiments of the present disclosure.

Aspects of the present disclosure are directed to automatic chip initialization retry. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

NAND memory devices work by trapping a charge in a cell (e.g., in a charge trap or floating gate) that then interferes with opening a channel by a control gate. The control gate read voltage is calibrated to be between two trapped charge states. Thus, if the channel opens (e.g., the control gate voltage can override the trapped charge) the cell has one value (e.g., a '1' in a single level cell (SLC)) and a different value if the channel does not open (e.g., a '0' in an SLC), Thus, it is important that the trapped charge is calibrated with the read voltage.

The calibration of the trapped charge and read voltage may be affected by several circumstances. For example, the trapped charge may dissipate over time. This may be detected and the cell may be refreshed. Refreshes help to preserve data integrity at the cost of wear on the cells themselves. Thus, blocks can be refreshed whenever cell voltage margins diminish on a block. The margins could deteriorate due to various combinations of charge gain and charge loss. However, too much refresh activity results in waste of both cell write and erase cycles and processing (e.g., leads to a performance impact for the NAND memory device as resources are used to perform the refresh).

Another issue with the calibration of the trapped charge and the read voltage is temperature. Generally, the threshold voltage can change with temperatures. The local media controller (e.g., NAND controller) typically compensates the voltages (e.g., read levels) based on the ambient temperature, referred to as temperature compensation. The threshold voltage and the read voltage adjustment may not go hand-in-hand because there may be several million transistors in a NAND package and there may be transistor-to-transistor differences with respect to the threshold voltage movement for a given change in temperature. Thus, programming at one temperature and reading at a different temperature tends to exacerbate margins, but the margin loss is temporary (e.g., it is curable by either adjusting the read voltage or by waiting until the read temperature is similar to the write temperature). To solve these issues—e.g., to minimize unnecessary refreshes due to cross-temperature related high fail bit count scenarios—the write temperature can be stored along with the data that was written. In unmanaged NAND memory devices, a host would typically monitor the temperatures constantly and include the write temperature in a user data area accessible to the host.

A thermometer implemented inside of the memory device (e.g., NAND) circuitry can be used to perform temperature readings. In NAND memory devices, it may or may not be possible to execute a dedicated temperature read using the thermometer for obtaining a temperature compensation. The ability to execute the dedicated temperature read can be based on timing of a current operation (e.g., read operation). One example of a case in which there is little to no time to execute a dedicated temperature read is a fast read operation or snap read operation (where partial page size is read by the host from the memory device with the benefit of reduced latency and performance increase. To address such scenarios, the thermometer can be turned on automatically and periodically at fixed refresh intervals. Since automatic temperature reads are generally asynchronous with respect to other memory operations (e.g., NAND operations), such as reads, writes and erases, automatic temperature reads can occur in very noisy phases due to memory device current demands causing voltage supply disturbances. Such voltage supply disturbances can corrupt the temperature result obtained from the automatic temperature read. This in turn can lead to an incorrect temperature compensations (e.g., too large or too small). Applying an incorrect temperature compensation during memory operations can result in an increase in errors. For example, with respect to read operations, an incorrect temperature compensation can result in increased raw bit error rate (RBER) and read operation failure. Although it would be the theoretical ideal to take continuous temperature readings with as little delay as possible between readings (e.g., infinitesimally small delays between each reading), doing so could be an inefficient use of memory resources.

Aspects of the present disclosure address the above and other deficiencies by having a memory sub-system that provides a thermometer with a delta mode option. The embodiments described herein can address the issue of obtaining incorrect temperature readings, such as those observed during noisy phases. More specifically, a fixed delay, referred to as an automatic refresh period, can be used to determine a suitable amount of time to wait between each automatic temperature reading. The automatic refresh period is determined to have a length that ensures that a temperature change between a stored temperature result and an automatic refresh temperature result obtained after the stored temperature result satisfies a threshold condition. For example, the threshold condition can be a designated range having a lower bound and an upper bound. In some embodiments, the lower bound is −1° C. and the upper bound is 1° C. (i.e., the automatic refresh temperature result is within +/−1° C. of the stored temperature result). Thus, even if the output of the thermometer is affected by an error due to noise, the impact is limited by performing the automatic refresh within a given automatic refresh window.

For example, the stored temperature result can be obtained by performing a number of temperature readings in a quiet phase (e.g., when a memory device has low current demands resulting in negligible supply voltage disturbances) to obtain a number of temperature measurements, averaging the temperature measurements to obtain the temperature result, and storing the temperature result on temperature output latches or registers. In some embodiments, the stored temperature result can be an initial temperature result obtained by performing an initialization routine. In some embodiments, the stored temperature result can be obtained by performing a forced temperature read to obtain a forced temperature result that replaces the previously stored temperature result (e.g., the initial temperature result or the previous forced temperature result). For example, the forced temperature read can be performed when the local media controller (e.g., NAND controller) knows that the temperature acquisition can be executed during a quiet phase. The automatic refresh temperature result can then be obtained by performing the automatic refresh operation upon determining that the elapsed time since obtaining the stored temperature result (e.g., the initial temperature result or the forced temperature result) is equal to the automatic refresh period.

Advantages of the present disclosure include, but are not limited to, lower cost, higher yield, and improved reliability and performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a temperature reading component 113. In some embodiments, the local media controller 135 includes at least a portion of the temperature reading component 113. In some embodiments, the temperature reading component 113 is part of the host system 110, an application, or an operating system. In other embodiments, memory sub-system controller 115 includes at least a portion of temperature reading component 113 and is configured to perform the functionality described herein.

The temperature reading component 113 can implement temperature readings for memory devices to reduce temperature compensation errors. For example, the temperature reading component 113 can perform automatic temperature readings to obtain temperature results in a manner that reduces corruption due to, e.g., system noise. More specifically, the automatic temperature readings can be performed to ensure that the corresponding temperature results satisfy a threshold temperature condition. For example, the threshold temperature condition can be that a difference between a current automatic temperature result and a previous temperature result falls within a designated range. The designated range can illustratively be between −1° C. and 1° C., although other ranges are contemplated based on the application. To do so, the automatic temperature readings can be performed in accordance with an automatic refresh period. In case the temperature result from an automatic temperature reading shows large deviation with respect to the previously stored data, it is filtered to fall within the designated range. The automatic refresh period can be determined based on experimental data, simulated data, etc. The period of automatic refresh can be trimmed (i.e., selected) during the probing of the memory device. In some embodiments, the period of automatic refresh is within the range of about 50 milliseconds (ms) to about 1 s. For example, the period of automatic refresh can be about 400 ms. By reducing corruption of temperature results obtained by performing automatic temperature readings, errors in temperature compensation performed during a memory device operation (e.g., a read operation, a write operation, or an erase operation) using the temperature results can be reduced, thereby improving memory device performance.

For example, the temperature reading component 113 can cause a digital thermometer ("thermometer") to obtain a first temperature result during a temperature reading. The first temperature result can be obtained by averaging multiple temperature measurements obtained during the temperature reading. The first temperature result can be an initial temperature result obtained by performing an initial temperature reading, a first automatic temperature result obtained by performing a first automatic temperature reading, or a forced temperature result obtained by performing a forced temperature reading. The temperature reading component 113 can then monitor a time since obtaining the first temperature result. Upon determining that the time satisfies a threshold time condition, the temperature reading component 113 can cause the thermometer to obtain a second temperature result from an automatic temperature reading that satisfies the threshold temperature condition. Further details with regards to the operations of the temperature reading component 113 are described below.

Figure 2:
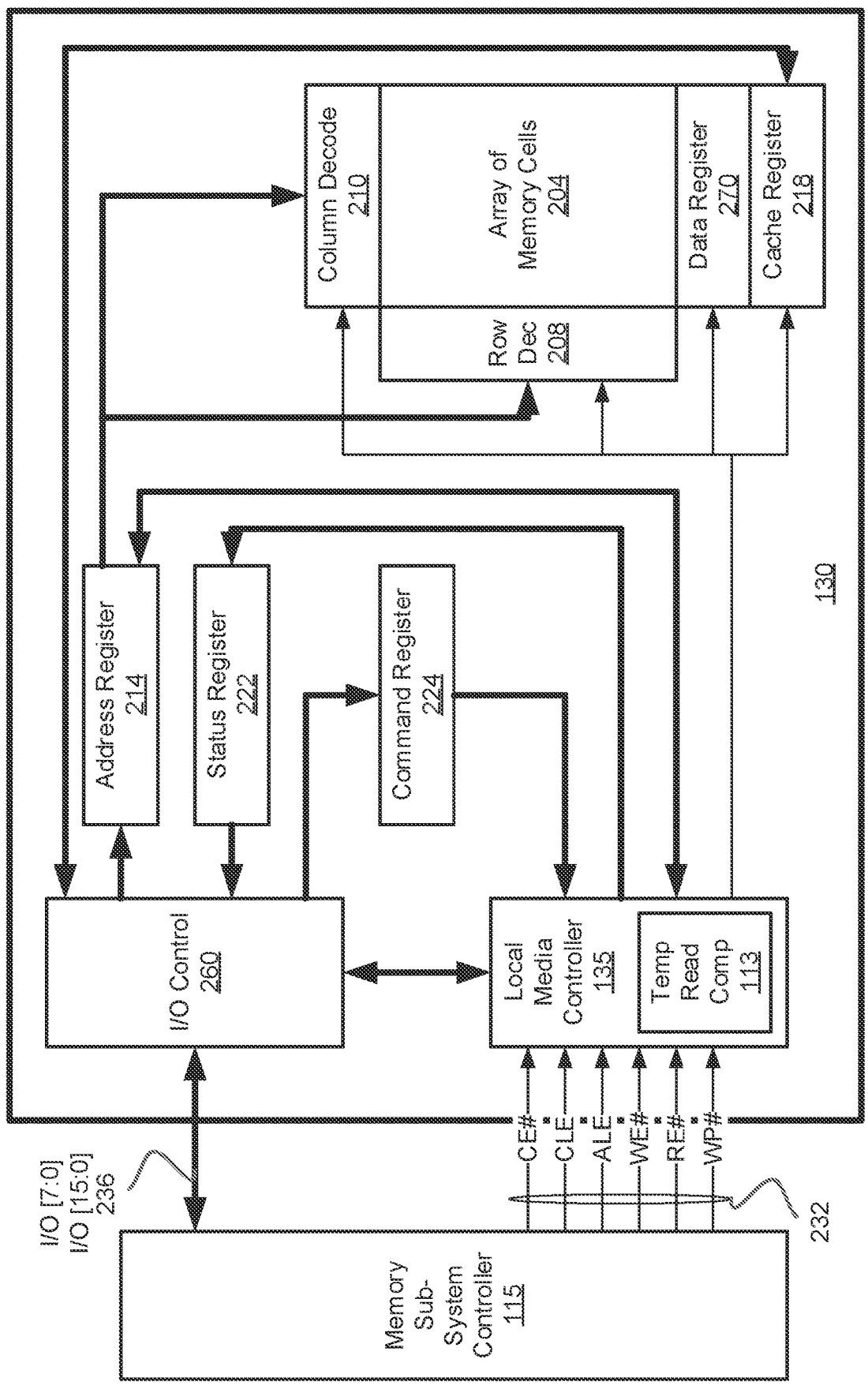
FIG. 2 is a block diagram of a memory device in communication with a memory sub-system controller of a memory sub-system in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes the temperature reading component 113, which can implement automatic temperature readings as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
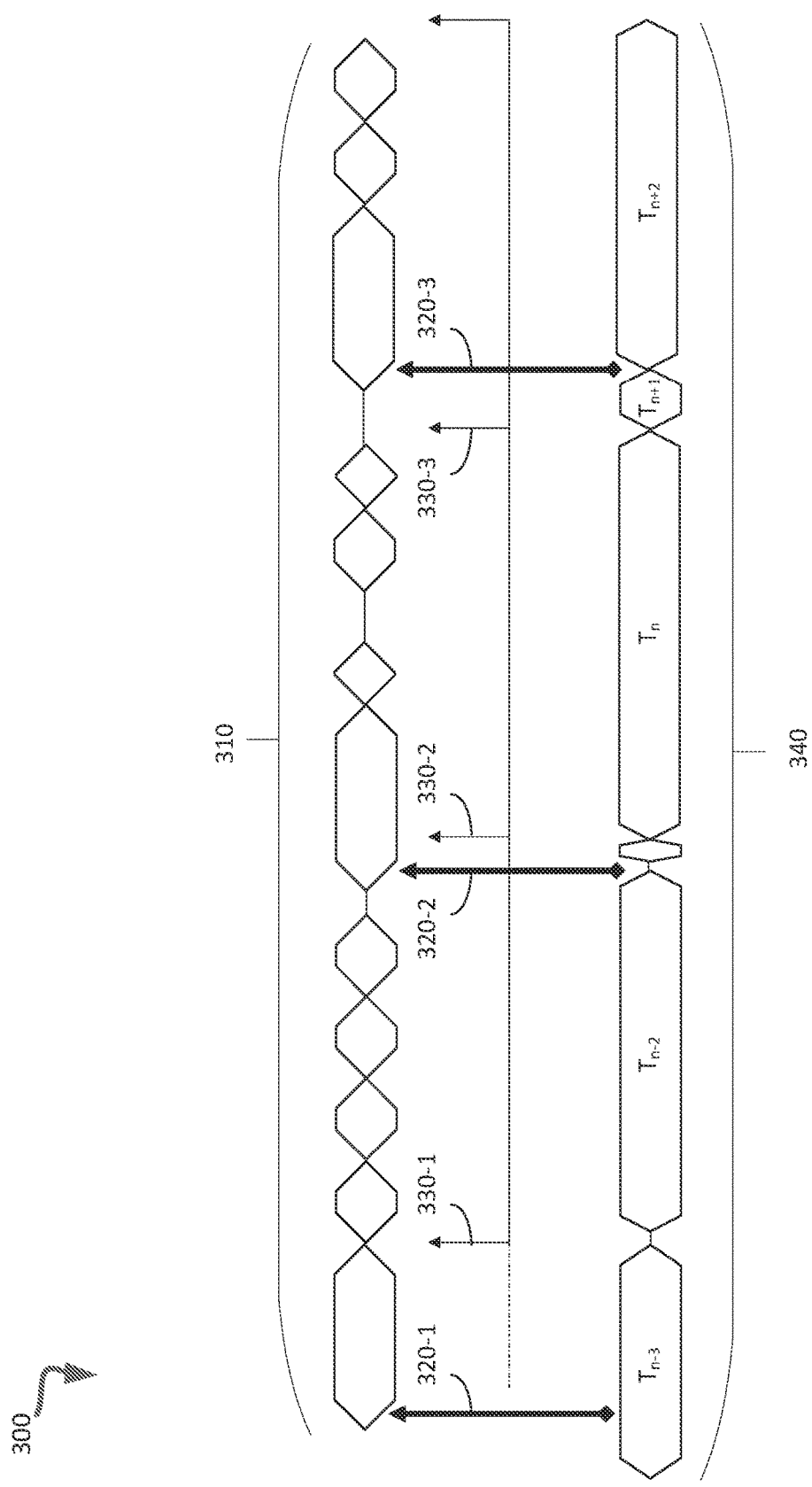
FIG. 3 is a diagram of an example system illustrating temperature readings that can be performed in accordance with some embodiments of the present disclosure.

FIG. 3 is a diagram of an example system 300 illustrating temperature readings that can be performed, in accordance with some embodiments of the present disclosure. As shown, the system 300 includes a set of different memory device operations 310. For example, each memory device operation of the set 310 can be a NAND device operation. The set of memory device operations 310 can include one or more read operations, one or more write operations, one or more erase operations, and any combination thereof.

During a memory device operation, adjustments can be made to voltages applied during the memory device operation in view of temperature measurements obtained from inside of the memory device (i.e., temperature compensations). To obtain the temperature measurements, temperature readings can be performed by a thermometer located inside of the memory device (e.g., NAND) circuitry.

In accordance with the timings of a memory device operation (e.g., "fast" or snap read operation), it may or may not be possible to cause the thermometer to execute a dedicated temperature reading. For this reason, a controller (e.g., local media controller) can cause the thermometer to perform an automatic temperature reading based on a fixed delay or period to obtain an automatic temperature measurement. The automatic temperature reading can be performed asynchronously with respect to other operations, and can be performed as part of an automatic refresh operation. The thermometer can also manage its own temperature readings without having to rely on the local media controller.

As shown, a number of temperature readings can be performed with respect to the set 310 to obtain respective temperature results using a thermometer. More specifically, a number of forced temperature readings 320-1 through 320-3 and a number of automatic temperature readings 330-1 through 330-3 are performed to obtain a set of temperature results 340. For example, the forced temperature reading 320-1 corresponds to a temperature result $T_{n-3}$, the automatic temperature reading 330-1 corresponds to a temperature result $T_{n-2}$, the forced temperature reading 320-2 corresponds to a temperature result $T_{n-1}$, the automatic temperature reading 330-2 corresponds to a temperature result $T_n$, the automatic temperature reading 330-3 corresponds to a temperature result $T_{n+1}$, and the forced temperature reading 320-3 corresponds to a temperature result $T_{n+2}$.

Although a forced temperature reading is generally performed during a phase that is known to be non-noisy or "quiet" with respect to supply voltage fluctuations, there is a chance that an automatic temperature reading can be performed in a noisy phase (since the automatic temperature readings are performed asynchronously based on a fixed delay). Thus, a temperature result obtained from an automatic temperature reading performed during a noisy phase can be a corrupt temperature result. The corrupt temperature result can then lead to an incorrect temperature compensation for the memory device operation. For example, the corrupt temperature result can lead to an incorrect temperature compensation with respect to a read level during a read operation.

In this illustrative example, it can be assumed that all of the temperature readings, except for the automatic temperature reading 330-2, have been performed during a quiet phase such that their corresponding temperature results are within a normal range. For example, $T_{n-3}=T_{n-2}=T_{n-1}=T_{n+1}=T_{n+2}=25°$ C. However, $T_n$ is determined to be $41°$ C. Since $41°$ C. is an abnormally high temperature result, it is apparent that $T_n$ is a corrupt temperature result that was obtained by the automatic temperature reading 330-2 during a noisy phase. If temperature compensation is performed using $T_n$, this can lead to an incorrect temperature compensation and potential memory device operation error (e.g., read error). This error can remain until the next temperature read.

As will be described in further detail herein, to limit the impact that noisy periods may have on automatic temperature readings, the fixed delay or period of automatic refresh can be chosen to be small enough to guarantee that any temperature variation is within a defined range. In other words, when an automatic refresh occurs, the difference between a current temperature result obtained during a current automatic temperature reading and a previous temperature result obtained during a previous temperature reading immediately preceding the current automatic temperature reading (ΔT) is within the range. For example, the previous temperature result can be an initial temperature result obtained during an initialization phase immediately preceding the current automatic temperature reading, an automatic temperature result obtained during an automatic temperature reading immediately preceding the current automatic temperature reading, or a forced temperature result obtained during a forced temperature reading immediately preceding the current automatic temperature reading. In some embodiments, the range is +/−1° C. (e.g., −1° C.≤ΔT≤1° C.). The period of automatic refresh can be trimmed (i.e., selected) during the probing of the memory device. In some embodiments, the period of automatic refresh is within the range of about 50 milliseconds (ms) to about 1 s. For example, the period of automatic refresh can be about 400 ms. However, any suitable ranges are contemplated.

Figure 4:
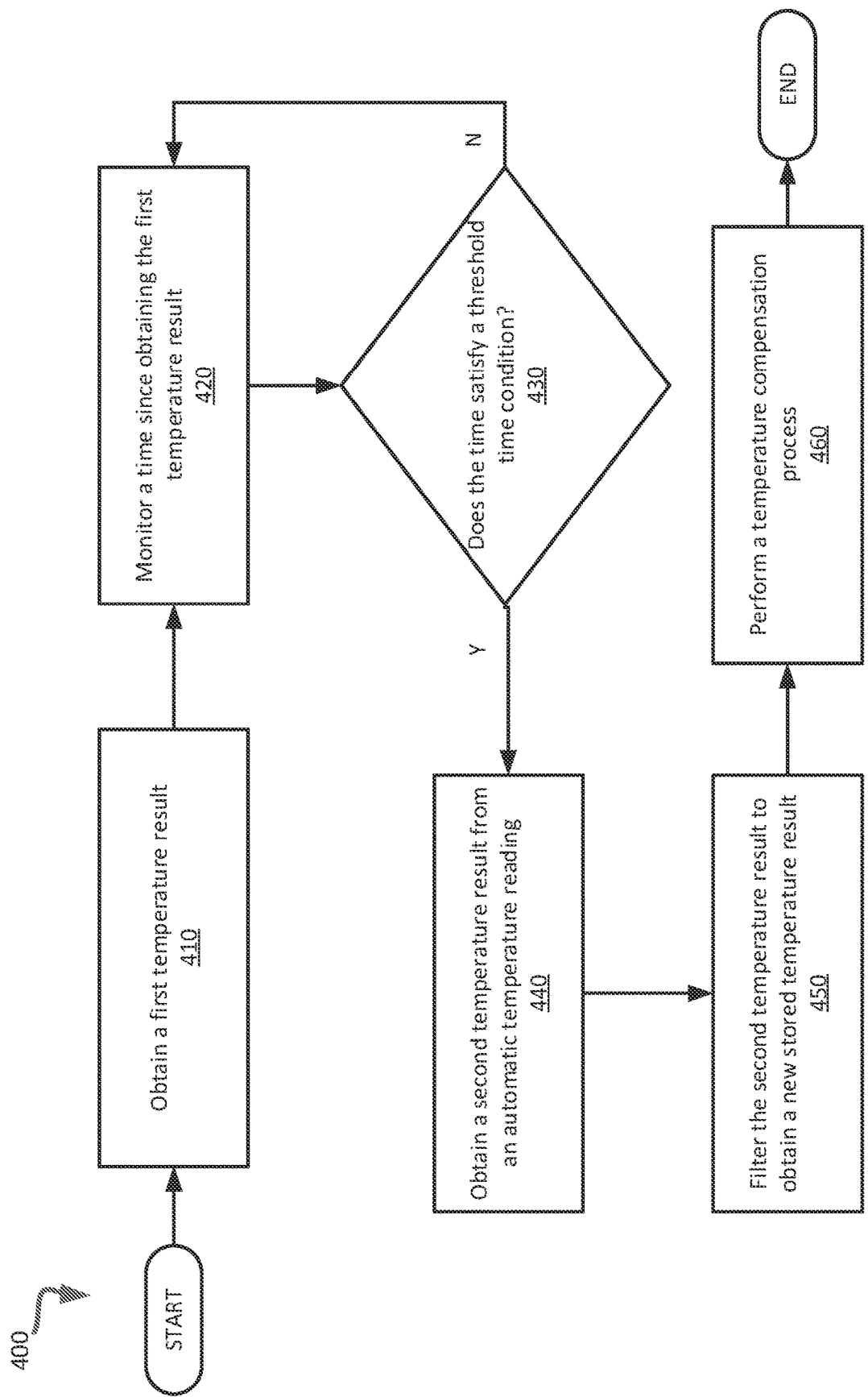
FIG. 4 is a flow diagram of an example method to implement a temperature reading for a memory device to reduce temperature compensation errors in accordance with some embodiments of the present disclosure.

FIG. 4 is a flow diagram of an example method 400 to implement a temperature reading for a memory device to reduce temperature compensation errors, in accordance with some embodiments of the present disclosure. The method 400 can be performed by processing logic or control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the temperature reading component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a first temperature result is obtained. For example, the processing logic can cause a thermometer to obtain the first temperature result. For example, the first temperature result can be obtained by performing a number of temperature measurements in the quiet phase, averaging the temperature measurements to obtain an average temperature measurement, and storing the average temperature measurement as the first temperature result. The first temperature result can be stored (e.g., on a set of temperature output latches and/or registers).

In some embodiments, the first temperature result is an initial temperature result obtained by performing a temperature reading during an initialization routine. In some embodiments, the first temperature result is obtained by performing a forced temperature reading that replaces a previously obtained temperature result (e.g., the initial temperature result or another temperature result). The first temperature result in these embodiments can be obtained when the local media device controller (e.g., NAND controller) knows that temperature acquisition can be executed during a quiet phase. In some embodiments, the first temperature result is obtained by performing an automatic temperature reading.

At operation 420, a time since obtaining the first temperature result is monitored. For example, the processing logic can cause a background timer to monitor the time. Monitoring the time can include determining an elapsed time by measuring a difference between a first time when the first temperature result was obtained and a second time corresponding to a current time.

At operation 430, it is determined whether the time satisfies a threshold time condition. The threshold time condition is used to help ensure that a temperature result obtained during an automatic temperature reading result falls within a designated range relative to the previously stored temperature result (e.g., the first temperature result). For example, the processing logic can determine whether the time satisfies a threshold time condition by determining whether the elapsed time is equal to a threshold amount of time. The designated range can be defined by a lower bound and an upper bound. In some embodiments, the lower bound is −1° C. and the upper bound is 1° C. However, such a designated range is not considered limiting.

If the time is determined to not satisfy the threshold time condition (e.g., the elapsed time is less than a threshold amount of time), the processing logic causes the controller to continue monitoring the time at operation 420. For example, the processing logic can monitor a second time after the first time.

However, if the time is determined to satisfy the threshold time condition at operation 430 (e.g., the elapsed time is equal to a threshold amount of time), this means that the performance of an automatic temperature reading should yield a temperature result that satisfies the threshold temperature condition. Thus, at operation 440, a second temperature result is obtained from an automatic temperature reading. For example, the processing logic can cause the thermometer to obtain the second temperature from the automatic temperature reading. The second temperature result can be obtained by performing a number of automatic temperature measurements during the automatic temperature reading, and averaging the automatic temperature measurements to obtain an average temperature measurement corresponding to the second temperature result. The automatic temperature reading can be performed as part of an automatic refresh operation. Accordingly, even if the temperature measurement of the thermometer is affected by an error due to noise, the impact of the error is limited by performing the automatic temperature reading in accordance with the time condition.

At operation 450, the second temperature result is filtered to obtain a new stored temperature result. For example, the processing logic can cause the second temperature result to be filtered by limiting a difference between the second temperature result and the previously stored temperature result in view of the designated range. More specifically, if the second temperature result is greater than the previously stored temperature result (e.g., the first temperature result), then the new stored temperature result is increased at most by the upper bound of the designated range (e.g., if the previously stored temperature result is the first temperature result and the upper bound is 1° C., then the maximum possible value of the new stored temperature result is the first temperature result +1° C.). If the second temperature result is less than the previously stored temperature result, then the new stored temperature result is decreased at most by the lower bound of the designated range (e.g., if the previously stored temperature result is the first temperature result and the lower bound is −1° C., then the minimum possible value of the new stored temperature result is the first temperature result −1° C.). If the second temperature result is equal to the previously stored temperature result, then the new stored temperature result is not modified (i.e., the stored temperature result remains the same).

At operation 460, a temperature compensation process is performed with respect to at least one variable. For example, the processing logic can cause the temperature compensation process to be performed based on the new stored temperature result. The at least one variable can be at least one of time, voltage, frequency, etc. The temperature compensation process can be performed digitally by any suitable technique. For example, the temperature can be performed by linear interpolation, using a look-up data structure (e.g., table), and/or by digital adders, by adding positive or negative offsets to digital representations of target analog voltages.

Figure 5:
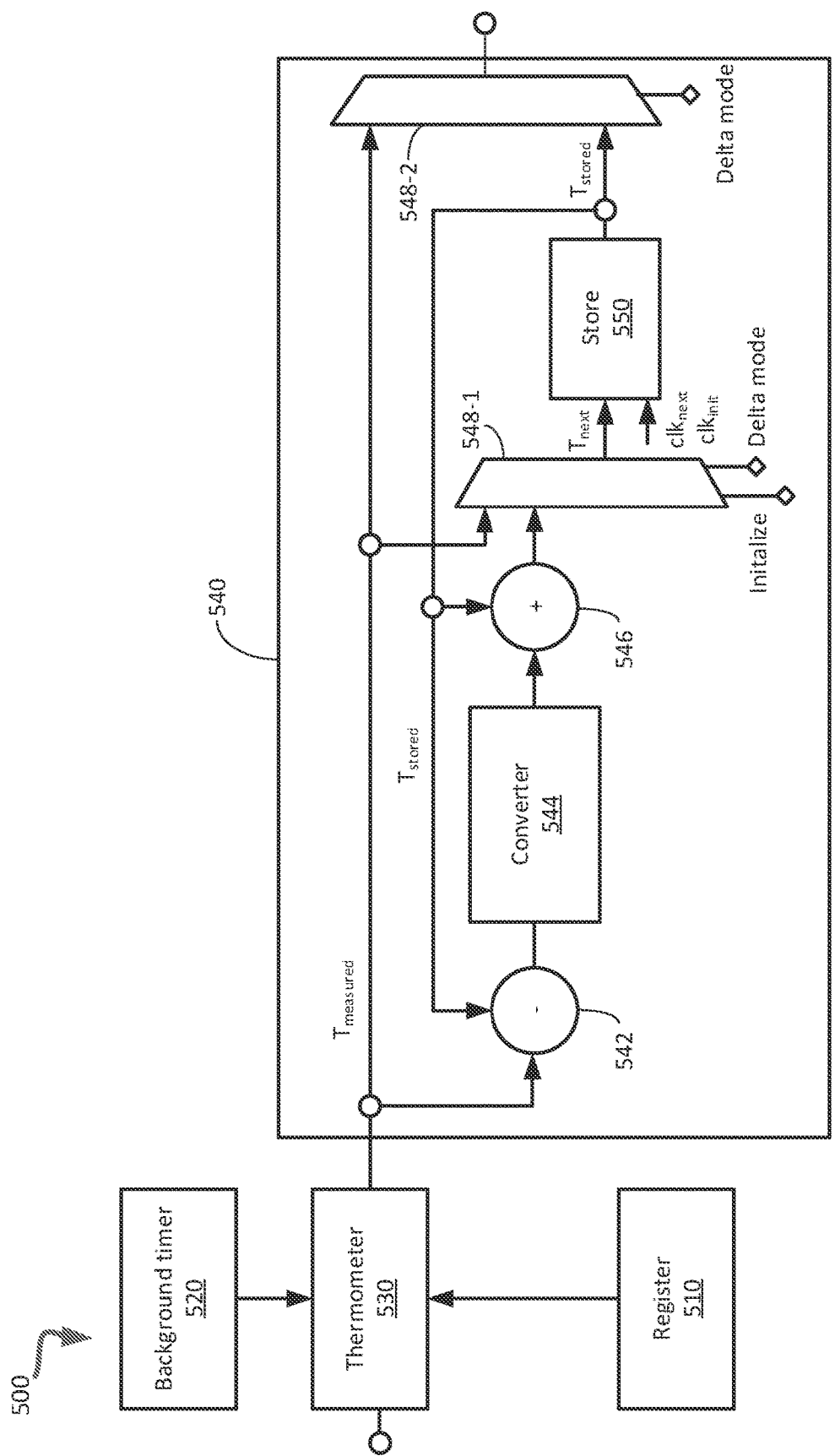
FIG. 5 is a schematic diagram of an example system to implement temperature readings for memory devices to reduce temperature compensation errors in accordance with some embodiments of the present disclosure.

FIG. 5 is a schematic diagram of an example system 500 to implement temperature readings for memory devices to reduce temperature compensation errors, in accordance with some embodiments of the present disclosure. The system 500 can be implemented by a media controller (e.g., a NAND controller). For example, the system 500 can be used to implement the method described above in FIG. 4.

As shown, the system 500 includes a register 510, a background timer 520, a thermometer 530, and automatic refresh circuitry 540. The automatic refresh circuitry 540 can include a subtractor 542, a converter 544, an adder 546, a first multiplexer 548-1, a second multiplexer 548-2, and a store (e.g., register or latch) 550.

The thermometer 530 is used to obtain a measured temperature ($T_{measured}$) and the store 550 is used to maintain a stored temperature ($T_{stored}$). The thermometer 530 can be implemented inside of the memory device (e.g., NAND) circuitry. The subtractor 542 can receive $T_{measured}$ and $T_{stored}$ and generate a corresponding subtractor output. The subtractor output can be negative, zero, or positive. The converter 544 can convert the subtractor output received from the subtractor 542 into a corresponding converted output. The converted output can include a bit string. As an illustrative example, if the subtractor output is zero, then the converter 544 can convert the subtractor output into the string "000000000". If the subtractor output is positive, then the converter 544 can convert the subtractor output into the string "000000001". If the subtractor output is negative, then the converter 544 can convert the subtractor output into the string "111111111". However, such an example should not be considered limiting. The adder 546 can receive the converted output and $T_{stored}$, and generate a corresponding adder output. The first multiplexer 548-1 can then receive the adder output and/or $T_{measured}$ to generate a next temperature ($T_{next}$) for storage in the store 550. The second multiplexer 548-2 can then receive $T_{measured}$ and/or $T_{stored}$ and output a temperature result.

When the system 500 is in an initialization mode, an initial temperature result ($T_{initial}$) can be obtained by the thermometer 530 using the register 510. For example, the thermometer 530 can obtain $T_{initial}$ result by performing multiple temperature measurements, and the multiple temperature measurements can be averaged to obtain $T_{initial}$. $T_{initial}$ can then be maintained in the store 550 as $T_{stored}$. Further details regarding obtaining the initial temperature measurement are described above with reference to FIG. 4.

When the system 500 is not in the initialization mode, the system 500 can operate in a delta mode. The delta mode functions to remove erroneous temperature results by limiting the temperature difference between $T_{measured}$ and $T_{stored}$ to +/−1, even if the absolute value of the difference between $T_{measured}$ and $T_{stored}$ is greater than 1.

For example, while operating in the delta mode, if $T_{measured}$ is equal to $T_{stored}$, then the output of the subtractor 542 is 0. Thus, the converter 544 generates a first output corresponding to a value of 0. When the first output is added to $T_{stored}$ at the adder 546, the adder 546 outputs a temperature of $T_{stored}+0=T_{stored}$. $T_{stored}$ is then stored as $T_{next}$ in the store 550.

As another example, if $T_{measured}$ is greater than $T_{stored}$, then the output of the subtractor is greater than 0. Thus, the converter 544 generates a second output corresponding to a value of 1. When the second output is added to $T_{stored}$ at the adder 546, the adder 546 outputs a temperature of $T_{stored}+1$. $T_{stored}+1$ is then stored as $T_{next}$ in the store 550.

As yet another example, if $T_{measured}$ is less than $T_{stored}$, then the output of the subtractor is less than 0. Thus, the converter 544 generates a third output corresponding to a value of −1. When the third output is added to $T_{stored}$ at the adder 546, the adder 546 outputs a temperature of $T_{stored}-1$. $T_{stored}-1$ is then stored as $T_{next}$ in the store 550.

Instead of operating in the delta mode when the system 500 is not in the initialization mode, the system 500 can alternatively operate in a third mode referred to as a "non-delta mode." While operating in the non-delta mode, if a temperature reading is not being forced, $T_{measured}$ is output as the temperature result without a comparison to $T_{stored}$. However, if a temperature reading is being forced, $T_{measured}$ can replace the previous $T_{stored}$ maintained in the store 550.

Figure 6:
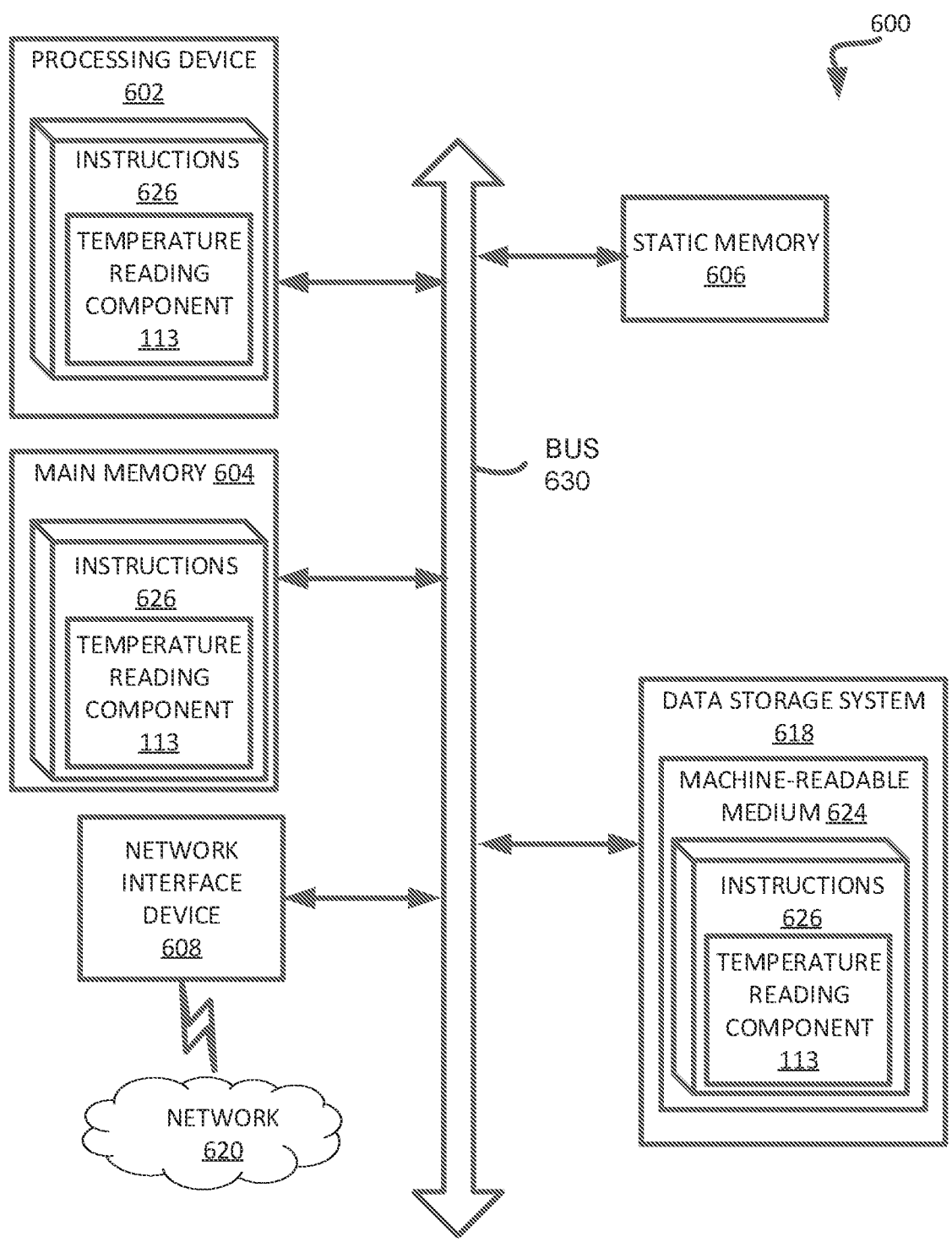
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature reading component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a temperature reading component (e.g., the temperature reading component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array;
a thermometer; and
control logic, operatively coupled with the memory array and the thermometer, to perform operations comprising:
  causing the thermometer to obtain a first temperature result;
  monitoring a time since obtaining the first temperature result;

determining whether the time satisfies a threshold time condition;

in response to determining that the time satisfies the threshold time condition, causing the thermometer to obtain a second temperature result from an automatic temperature reading;

determining a difference between the second temperature result and a previously stored temperature result; and filtering the second temperature result based on the difference to obtain a new stored temperature result.

2. The memory device of claim 1, wherein the first temperature result is an initial temperature result obtained during an initial temperature reading.

3. The memory device of claim 2, wherein the first temperature result is a forced temperature result obtained during a forced temperature reading performed after the initial temperature reading.

4. The memory device of claim 1, wherein the first temperature result is obtained by performing a number of temperature measurements in a quiet phase, averaging the temperature measurements to obtain an average temperature measurement, and storing the average temperature measurement as the first temperature result.

5. The memory device of claim 1, wherein monitoring the time comprises determining an elapsed time by measuring a difference between a first time when the first temperature result was obtained and a second time corresponding to a current time.

6. The memory device of claim 5, wherein determining that the time satisfies the threshold time conditions comprises determining that the elapsed time is equal to a threshold amount of time.

7. The memory device of claim 1, wherein filtering the second temperature result based on the difference comprises limiting the difference in view of a designated range having an upper bound and a lower bound.

8. The memory device of claim 1, wherein the operations further comprise, after filtering the second temperature result, causing a temperature compensation process to be performed with respect to at least one variable.

9. A method comprising:
causing a thermometer to obtain a first temperature result;
monitoring a first time since obtaining the first temperature result;
determining whether the first time satisfies a threshold time condition;
in response to determining that the first time does not satisfy the threshold condition, monitoring a second time since obtaining the first temperature result;
determining that the second time satisfies the threshold time condition; and
in response to determining that the time satisfies the threshold time condition, causing the thermometer to obtain a second temperature result from an automatic temperature reading;

determining a difference between the second temperature result and a previously stored temperature result; and filtering the second temperature result based on the difference to obtain a new stored temperature result.

10. The method of claim 9, wherein the first temperature result is an initial temperature result obtained during an initial temperature reading.

11. The method of claim 9, wherein the first temperature result is a forced temperature result obtained during a forced temperature reading performed after the initial temperature reading.

12. The method of claim 9, wherein the first temperature result is obtained by performing a number of temperature measurements in a quiet phase, averaging the temperature measurements to obtain an average temperature measurement, and storing the average temperature measurement as the first temperature result.

13. The method of claim 9, wherein filtering the second temperature result based on the difference comprises limiting the difference in view of a designated range having an upper bound and a lower bound.

14. The method of claim 9, further comprising, after filtering the second temperature result, causing a temperature compensation process to be performed with respect to at least one variable.

15. A system comprising:
a thermometer to obtain temperature measurements; and
automatic refresh circuitry to:
maintain a stored temperature result obtained by the thermometer from a forced temperature reading;
receive a measured temperature result obtained by the thermometer from an automatic temperature reading;
determine a difference between the stored temperature result and the measured temperature result; and
filter the measured temperature result based on the difference to obtain a new stored temperature result to replace the stored temperature result.

16. The system of claim 15, further comprising a background timer operatively coupled to the thermometer.

17. The system of claim 16, wherein the automatic refresh circuitry comprises:
a subtractor to generate the difference between the stored temperature result and the measured temperature result;
a converter to convert the difference to obtain a converted output; and
an adder to obtain the new stored temperature result from the converted output and the stored temperature.

18. The system of claim 16, wherein the forced temperature reading is an initial temperature reading obtained during initialization.

19. The system of claim 18, further comprising a register to provide the initial temperature.

20. The system of claim 16, wherein the forced temperature reading is a forced temperature reading obtained after initialization.

* * * * *